United States Patent
Kawanishi et al.

(10) Patent No.: US 8,014,684 B2
(45) Date of Patent: Sep. 6, 2011

(54) MODULATION LIGHT SIGNAL GENERATING DEVICE AND FSK MODULATION SIGNAL GENERATING DEVICE

(75) Inventors: Tetsuya Kawanishi, Tokyo (JP); Hiroshi Harada, Tokyo (JP); Masayuki Izutsu, Tokyo (JP)

(73) Assignee: National Institute of Information and Communications Technology, Incorporated Administrative Agency, Tokyo (JP)

( * ) Notice: Subject to any disclaimer, the term of this patent is extended or adjusted under 35 U.S.C. 154(b) by 906 days.

(21) Appl. No.: 11/571,281

(22) PCT Filed: Jun. 29, 2005

(86) PCT No.: PCT/JP2005/012444
§ 371 (c)(1), (2), (4) Date: Sep. 5, 2007

(87) PCT Pub. No.: WO2006/004144
PCT Pub. Date: Jan. 12, 2006

(65) Prior Publication Data
US 2008/0159754 A1    Jul. 3, 2008

(30) Foreign Application Priority Data
Jun. 30, 2004    (JP) .................................. 2004-192376

(51) Int. Cl.
H04B 10/04    (2006.01)
H04B 10/12    (2006.01)

(52) U.S. Cl. ...................................... 398/187; 398/201
(58) Field of Classification Search .................. 398/183
See application file for complete search history.

(56) References Cited

U.S. PATENT DOCUMENTS

| | | | |
|---|---|---|---|
| 7,053,814 B2 * | 5/2006 | Yap | 342/54 |
| 7,239,442 B2 * | 7/2007 | Kourogi et al. | 359/346 |
| 2001/0055141 A1 * | 12/2001 | Kawanishi | 359/246 |
| 2002/0181073 A1 | 12/2002 | Kawanishi | |

FOREIGN PATENT DOCUMENTS

| | | |
|---|---|---|
| EP | 1168042 A2 | 1/2002 |
| JP | 05-14264 A | 1/1993 |
| JP | 2002-148666 A | 5/2002 |
| JP | 2002-277916 A | 9/2002 |
| WO | WO 03/010596 A1 * | 2/2003 |

OTHER PUBLICATIONS

European Search Report dated Aug. 6, 2009, issued in corresponding European Patent Application No. 05758116.7. Kawanishi, Tetsuya et al.; "Integrated Reciprocating Optical Modulator for Optical High-Order Sideband Generation"; Japanese Journal of Applied Physics, 2004, pp. 5791-5794, vol. 43, No. 8.
International Search Report of PCT/JP2005/012444, date of mailing Aug. 16, 2005.
International Preliminary Report on Patentability Form PCT/IB/338 mailed Mar. 1, 2007 of International Application No. PCT/JP2005/012444.

* cited by examiner

*Primary Examiner* — Shi K Li
(74) *Attorney, Agent, or Firm* — Westerman, Hattori, Daniels & Adrian, LLP

(57) ABSTRACT

The object of the present invention is to provide a modulated optical signal generator utilizing the mechanism of a multiply optical modulator, and a modulated signal generator capable of outputting millimeter waves and the like utilizing the modulated optical signal generator.
The above-mentioned object is solved by a modulated optical signal generator (1) provided with an optical modulator (2), a first optical filter (3), and a second optical filter (4), wherein a frequency of a multiplying optical modulation outputted from the second optical filter (4) is controlled by controlling the frequency of the modulating signal inputted to the optical modulator (2).

6 Claims, 6 Drawing Sheets

Fig. 5
Fig. 5A
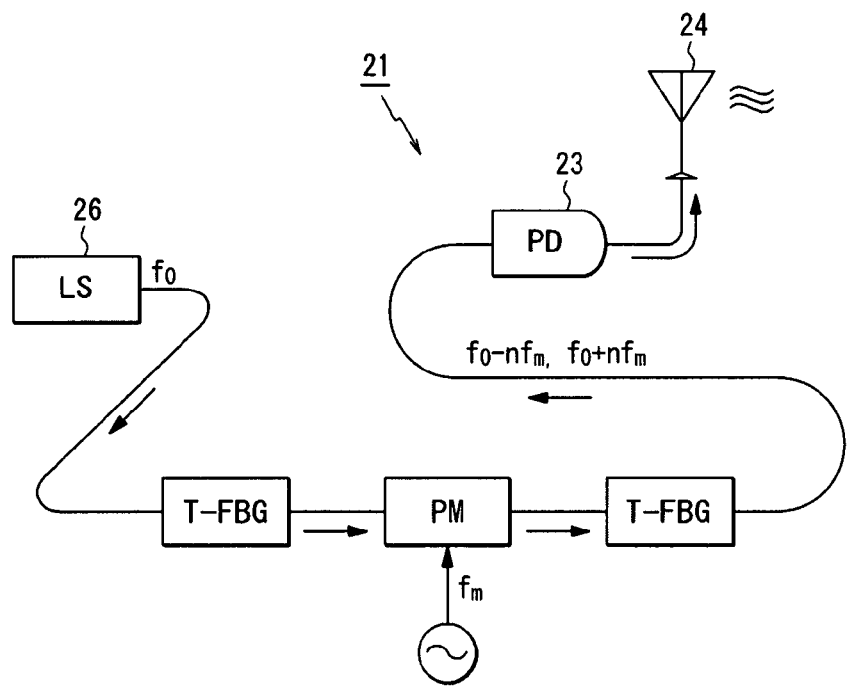
Fig. 5B
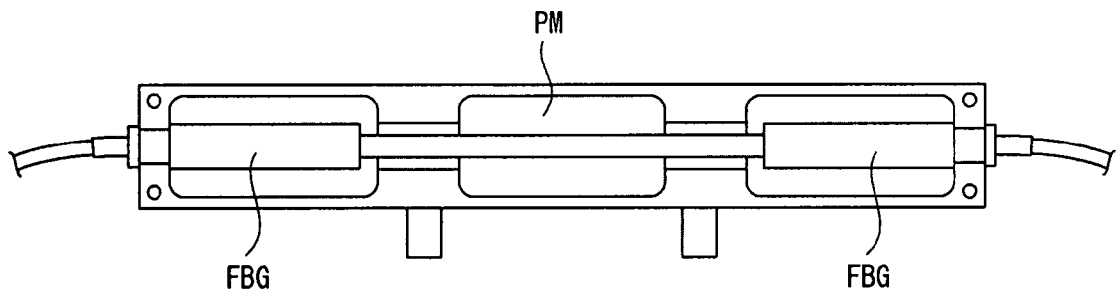

Fig. 6
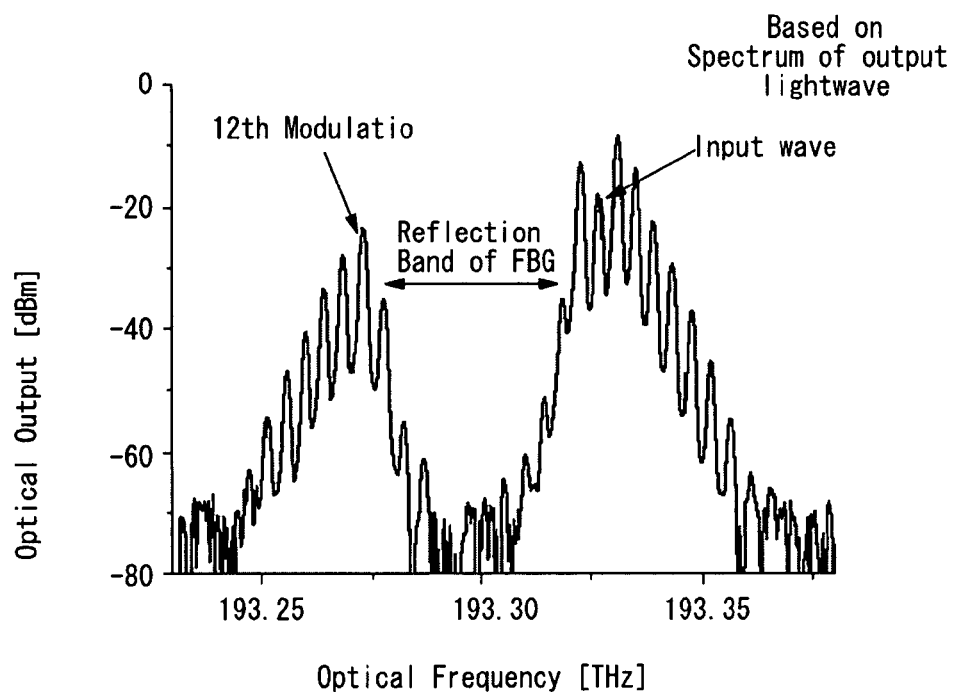
Fig. 7
Fig. 7A
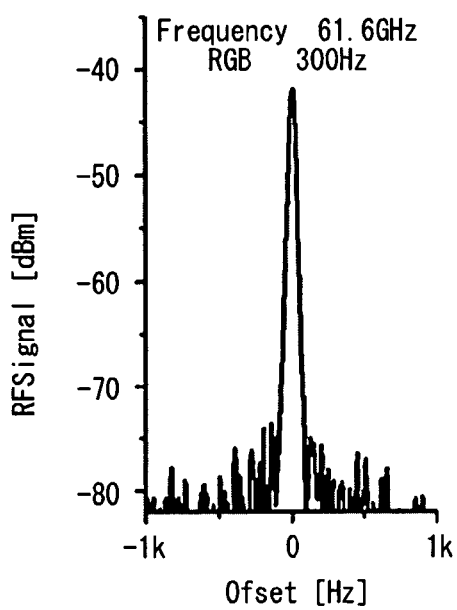
Fig. 7B
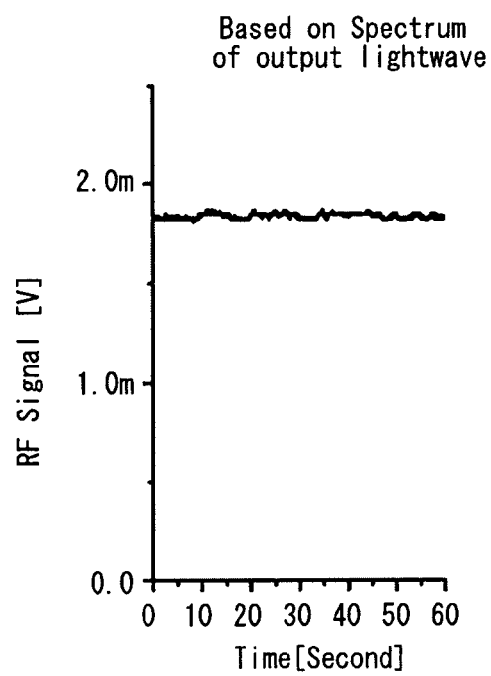

Fig. 9        PRIOR ART

MODULATION LIGHT SIGNAL GENERATING DEVICE AND FSK MODULATION SIGNAL GENERATING DEVICE

TECHNICAL FIELD

The present invention relates to a modulated optical signal generator and the like. More specifically, the present invention relates to a modulated optical signal generator utilizing a mechanism of a multiply optical modulator, and a frequency shift keying (FSK) modulated signal generator capable of outputting millimeter waves and the like utilizing the modulated optical signal generator.

BACKGROUND ART

An optical multiplying modulator performing an optical modulation by a multiplying modulation has already been known (see Japanese Patent No. 3404528, Japanese Patent No. 3343241, Japanese Patent Application Laid-Open Publication No. 2002-148572, and Japanese Patent No. 3496053). FIG. 8 is a block diagram (FIG. 1 of Japanese Patent No. 3404528) showing a basic principle of a conventional optical frequency modulator by a multiplying modulation. This optical multiplying modulator is a frequency converter by the multiplying modulation provided with a structure for modulating a light of a predetermined frequency to obtain a secondary sideband wave group, a structure for modulating an nth order sideband wave group to obtain an (n+1)th order sideband wave group, and a structure for selecting a specific singe sideband wave from among a plurality of sideband wave groups by using a narrowband filter (claim 1 of Japanese Patent No. 3404528).

As shown in FIG. 8, a more specific basic arrangement of an optical multiplying modulator (101) is provided with an optical modulator (102), a first filter (103) for controlling a light inputted to and outputted from the optical modulator (102), a second filter (104) for controlling a light inputted to and outputted from the optical modulator (102), and a modulating signal source (105) for inputting a modulating signal to the optical modulator (102). The first filter (103) is a narrowband filter that has a characteristic of reflecting a light marginally deviated from a certain frequency $f_0$ and transmitting lights having other frequencies. Also, the optical modulator (102) is an optical intensity modulator (or an optical phase modulator) capable of modulating an input light in whichever direction of a leftward direction and a rightward direction by a characteristic of a modulating frequency $f_m$. The second filter (104) is a filter (bandlimiting filter) having a characteristic of transmitting a light having a specific frequency (e.g. the third sideband waves) and reflecting other lights.

The basic operation of the optical multiplying modulator is as follows: FIG. 9 is a schematic diagram showing the basic operation of the optical multiplying modulator. As shown in FIG. 9(A), an input light has a single frequency $f_0$ [Hz]. The light of the frequency $f_0$ having been inputted through the first filter (103) is modulated by the optical modulator (102) and generates sideband waves as shown in FIG. 9(B). (It is to be noted that for the sake of simplicity, it is supposed that only the carrier wave $f_0$ and the primary sideband wave group ($f_0-f_m$ and $f_0+f_m$) are generated.) The carrier wave and the primary sideband wave group are reflected by the second filter (104) and pass through the optical modulator (102) again. Upon passing through the optical modulator (102), these lights are modulated and outputted as lights having spectrums shown in FIG. 9(C). Among these lights, the carrier wave $f_0$ passes through the first filter (103). Namely, spectrums of lights reflected by the first filter (103) are as shown in FIG. 9(D). These lights reflected by the first filter (103) pass though the optical modulator (102) again. Then, these lights are modulated by the optical modulator (102) and become lights having spectrums shown in FIG. 9(E). Namely, light groups shown in FIG. 9(E) has the primary sideband wave group ($f_0\pm f_m$) and the third-order sideband wave group ($f_0+3f_m$). Among these, the primary sideband wave group shown in FIG. 9(F) is reflected by the second filter (104). It is to be noted that these light groups are lights having similar frequencies with those of the light groups shown in FIG. 9(B). On the other hand, the third-order sideband waves pass through the second filter (104). Thus, the third-order sideband waves are outputted from the optical multiplying modulator as output lights. By controlling a transmitting region of the second filter (104), the frequencies of the lights obtained as the output lights can be controlled. Namely, by thus using the optical multiplying modulator, a high-order sideband wave group can be obtained. It is to be noted that for the optical modulator (102), modulators such as an intensity modulator and a phase modulator can be mentioned.

An FSK (frequency shift keying) technology has already been known. For example, an invention related to an optical transmission system capable of performing a good demodulation without using electric components for broadband and high frequency is disclosed by the Japanese Application Laid-Open Publication No. 11-331089. As an angle modulating signal, an FSK modulating signal that is a digital signal whose frequency is modulated is used.

Also, a millimeter wave FSK transmitting and receiving system where one parent station and "N" unites of child stations are wirelessly communicating in a millimeter waveband that requires a high-quality communication in an in-house communication that generates multiple reflection is disclosed by the Japanese Application Laid-Open Publication No. 10-150380.

Also, a circuit configuration technology for configuring a receiver receiving an FSK signal by a direct conversion receiving method is disclosed by the Japanese Application Laid-Open Publication No. 09-224059.

DISCLOSURE OF THE INVENTION

As described above, while a multiply optical modulator has been already known, a frequency shift keying apparatus utilizing the principle of the multiply optical modulator has not been known. Accordingly, it is an object of the present invention to provide an FSK modulated optical signal generator utilizing a mechanism of the multiply optical modulator, and an FSK modulated signal generator capable of outputting millimeter waves and the like utilizing the FSK modulated optical signal generator.

The present invention is based on knowledge that a modulated optical signal having several times as much modulation as that of a modulating frequency can be obtained by utilizing the mechanism of the multiply optical modulator.

[1] Namely, in order to achieve the above-mentioned object, a modulated optical signal generator according to the present invention is provided with a multiply optical modulator; and an RF signal source for controlling a frequency of a modulating signal inputted to the multiply optical modulator; wherein a frequency of a signal outputted from the multiply optical modulator is controlled by controlling the frequency of the modulating signal.

A conventional multiply optical modulator has been able to output a signal having a frequency several times as much as that of a carrier wave. On the other hand, it has been considered that when an intensity or a phase of a modulating signal inputted to the multiply optical modulator is changed, the lights interfere with one another, so that an intensity or a phase of an output does not coincide with a change of the intensity or phase. Therefore, there has not been an idea of transmitting information by a change of the modulating signal. The modulated optical signal generator of the present invention is based on an unprecedented knowledge that a frequency change of an output corresponds to a frequency change of a modulating signal on a one-on-one basis, so that transmission of information is possible by the frequency change of the modulating signal. Thus, it is made possible to obtain an output light having a shift corresponding to several times the frequency change by changing the modulating frequency.

[2] Another aspect of a modulated optical signal generator of the present invention is a modulated optical signal generator provided with an optical modulator (2) modulating a light outputted by controlling a frequency of a modulating signal; a first optical filter (3) transmitting a light of a predetermined frequency domain among a light inputted to the optical modulator (2) and a light outputted from the optical modulator (2) while reflecting a light of other frequencies; a second optical filter (4) transmitting a light of a predetermined frequency domain among a light inputted to the optical modulator (2) and a light outputted from the optical modulator (2) while reflecting a light of other frequencies; and an RF signal source (5) generating the modulating signal inputted to the optical modulator (2); wherein a frequency of a multiplying optical modulation outputted from the second optical filter (4) is controlled by controlling the frequency of the modulating signal inputted to the optical modulator (2). The modulated optical signal generator of the present invention can input the modulating signal from the RF signal source (5) to the optical modulator (2), so that an amount of frequency change between the two filters can be controlled and a modulating signal having an amount of change that is several times that of the modulating signal.

[3] A preferred embodiment of the modulated optical signal generator is the modulated optical signal generator as described in the above-mentioned [2], wherein the first optical filter (3) is a narrowband filter, and the second filter (4) is a band limiting filter.

[4] Another preferred embodiment of the modulated optical signal generator is the modulated optical signal generator as described in the above [2] including an optical amplifier (6) amplifying intensities of the light inputted to the optical modulator (2) and the light outputted from the optical modulator (2).

[5] In order to achieve the above-mentioned object, an FSK modulated signal generator of the present invention is an FSK modulated signal generator provided with a modulated optical signal generator described in the above-mentioned [1]-[4]; a photodetector (23) detecting an output light of the modulated optical signal generator to be converted into an electric signal; and an antenna (24) emitting the electric signal converted by the photodetector as a radio signal; wherein a frequency of an optical signal outputted from the modulated optical signal generator is controlled by controlling a modulating frequency of the modulated optical signal generator, whereby a frequency of the radio signal emitted from the antenna is controlled and the frequency shift keying is performed.

According to the present invention, it is made possible to provide a modulated optical signal generator utilizing the mechanism of a multiply optical modulator, and an FSK modulated signal generator capable of outputting millimeter waves and the like utilizing the modulated optical signal generator.

BRIEF DESCRIPTION OF THE DRAWINGS

FIG. 4(A) is a diagram showing a spectrum of an input light. FIG. 4(B) is a diagram showing a spectrum of an upper sideband wave ($f_0+f_m$). FIG. 4(C) is a diagram showing a spectrum of a secondary upper sideband wave. FIG. 4(D) is a diagram showing a spectrum of a third-order upper sideband wave. FIG. 4(E) is a diagram showing a spectrum of a third-order lower sideband wave. FIG. 4(F) is a diagram showing a spectrum of obtained signal.

FIG. 5 is a diagram showing an arrangement of an FSK modulated signal generator exemplifying the present invention. FIG. 5(A) is a schematic diagram of the apparatus FIG. 5(B) is a diagram showing an arrangement of actual two T-FBG's (corresponding to optical filters) and a PM.

FIG. 6 is a spectrum diagram showing a state of an output light.

FIG. 7 is a measurement result showing a state of an output radio signal. FIG. 7(A) is a spectrum diagram showing an output spectrum. FIG. 7(B) is a graph showing a temporal change of an output radio signal.

FIG. 9 is a schematic diagram showing a basic operation of an optical multiplying modulator.

BEST MODE OF CARRYING OUT THE INVENTION

1. Modulated Optical Signal Generator

Figure 1:
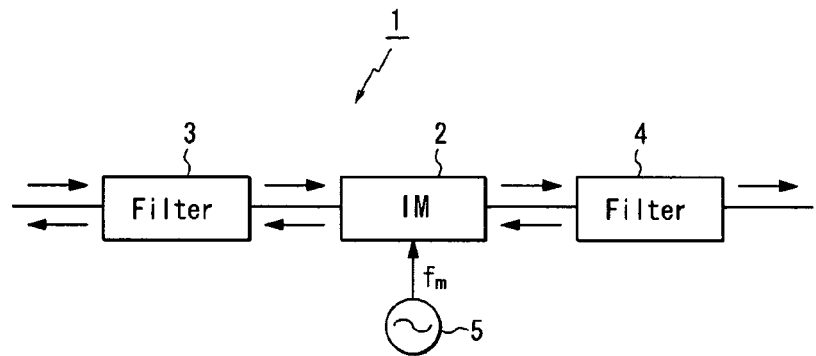
FIG. 1 is a schematic diagram showing a basic arrangement of a modulated optical signal generator of the present invention according to the first embodiment.

FIG. 1 shows a basic arrangement of a modulated optical signal generator of the present invention according to a first embodiment. As shown in FIG. 1, the modulated optical signal generator of the present invention is provided with an optical modulator (2), a first optical filter (3), a second optical filter (4), and an RF signal source (5), and controls a frequency of a multiplying optical modulation outputted from the second optical filter (4) by controlling a frequency of a modulating signal inputted to the optical modulator (2). It is to be noted that the above-mentioned arrangement is basically provided with a multiply optical modulator, and an RF signal source for controlling a frequency of a modulating signal inputted to the multiply optical modulator, wherein the above-mentioned publicly known multiply optical modulator, for example, can be used as the multiply optical modulator as appropriate.

1.1. Optical Modulator

An optical modulator is an apparatus for applying modulation to at least one of a frequency of light, an intensity of light, and a phase of light. For such an optical modulator, a frequency modulator, an intensity modulator, and a phase modulator can be mentioned. While an intensity modulator (IM) is described in FIG. 1, the optical modulator is not limited to an IM. The optical modulator (2) is connected to the RF signal source (5). The RF signal source (5) is a signal source for generating a modulating signal to be inputted to the optical modulator (2). A light passing through this optical modulator (2) has its frequency shifted by a predetermined amount in the same way as the optical modulator in a conventional optical multiplying modulator.

It is to be noted that optical modulators include a resonant-type modulator and a traveling-wave-type modulator. A resonant-type optical modulator is a modulator that performs a modulation by using a resonance of a modulating signal. As the resonant-type modulator, a publicly known resonant-type modulator can be adopted. For example, a resonant-type modulator described in Japanese Patent Application Laid-Open No. 2002-268025, "T. Kawanishi, S. Oikawa, M. Izutsu, "Optical Modulator with Planar Structure", TECHNICAL REPORT OF IEICE, IQE2001-3 (2001-05)" can be adopted. The traveling-wave-type optical modulator is a modulator that guides an optical wave and an electric signal in the same direction and modulates light while the optical wave and the electric signal are guided (e.g., Hiroshi Nishihara, Haruna Masamitsu, Toshiaki Suhara, "optical integrated circuit" (revised and updated edition), Ohmsha, pages 119 to 120). A publicly known traveling-wave-type electrode such as those disclosed in Japanese Patent Application Laid-Open Nos. 11-295674, 11-295674, 2002-169133, 2002-40381, 2000-267056, 2000-471159, and 10-133159, for example, can be used as the traveling-wave-type modulator. The traveling-wave-type modulator is preferable since modulations of the same characteristic are enabled for lights entering from any direction by inputting the modulating signals from electrodes at both ends.

It is supposed that a time for the light to be transmitted between the two optical filters (namely, a time for a reflection to occur) is T [s]. A modulating frequency $f_m$ [Hz] where an effective reciprocating modulation can be applied is 1/T multiplied by an even number or an odd number. Therefore, 1/T multiplied by an even number or an odd number is preferable as the $f_m$. In case an in-phase modulation by an optical modulator sandwiched by two optical filters is applied in either of the case where a light travels in forward direction and in backward direction, 1/T multiplied by an even number is preferable as the $f_m$. Also, in case a reversed-phase modulation by an optical modulator sandwiched by two optical filters is applied in either of the case where a light travels in forward direction and in backward direction, 1/T multiplied by an odd number is preferable as the $f_m$. Also, a certain range centered around the preferable frequency can be mentioned as a bandwidth where a modulation by the modulating signal is enabled, and shifting the modulating frequency within this range can be mentioned. For such a shifting range of a frequency, between 0 and 1/T inclusive can be mentioned. Also, between 0 and 1/4T inclusive, between 0 and 1/10T inclusive, between 0 and 1/100T inclusive, between 1/100T and 1/T inclusive, between 1/100T and 1/4T inclusive, between 1/100T and 1/10T inclusive, between 1/10T and 1/4T inclusive, between 1/10T and 1/T inclusive, and between 1/4T and 1/T inclusive can be mentioned.

1.2. Optical Filter

As an optical filter, a narrowband filter and a bandlimiting filter can be mentioned. A fiber grating can be mentioned as a more specific optical filter, and a fiber grating capable of modulating can be mentioned as a more preferable optical filter. A preferable narrowband filter is one that is capable of controlling a transmitting spectrum characteristic by applying a voltage, an electric current, a temperature, a magnetic field, a pressure, an electromagnetic wave, or the like. As a narrowband filter, one described in Japanese Patent Application Laid-Open No. 11-95184 can be mentioned for example. As a specific bandlimiting filter, ones described in Japanese Patent Application Laid-Open Nos. 2001-16073, 2001-86094, 2000-244590, and 1-246988 can be mentioned. It is to be noted that the first filter (3) is preferably the narrowband filter. Also, the second filter (4) is preferably the bandlimiting filter.

1.3. Light Source

A publicly known light source can be adopted for a light source of a modulated optical signal generator. A preferable modulated optical signal generator is a diode, a laser diode, or the like.

1.4. Another Embodiment

Figure 2:
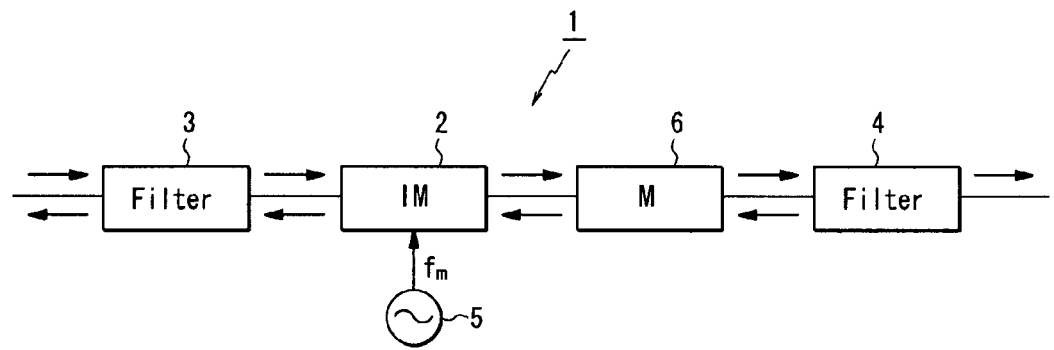
FIG. 2 is a schematic diagram showing a basic arrangement of a modulated optical signal generator of the present invention according to another embodiment.

FIG. 2 is a schematic diagram showing a basic arrangement of a modulated optical signal generator according to another embodiment of the present invention. As shown in FIG. 2, the modulated optical signal generator of this embodiment is provided with another optical modulator (6) between the optical modulator (2) and the second optical filter (4) in the modulated optical signal generator shown in FIG. 1. It is to be noted that while not shown, the optical modulator (6) may be provided between the optical modulator (2) and the first optical filter (3). Also, the the optical modulator (6) may be provided between the optical modulator (2) and the first optical filter (3) as well as between the optical modulator (2) and the second optical filter (4)

1.5. Optical Modulator

As the optical modulator (6) used in this embodiment, an intensity modulator (such as an optical amplifier), a phase modulator, a dispersion compensator, and the like can be mentioned. One optical modulator (6) or more than two optical modulators (6) may be used. By using an optical amplifier, an intensity of light attenuated by the modulator can be compensated. Also, by an intensity modulation, an intensity of an output light can be modulated. Also, by using a phase modulator, new information can be superimposed by providing the phase modulator with a modulating signal so as to modulate the output light. A dispersion compensator is for negating dispersion. However, even if a dispersion compensator is not provided, the same effect as providing a dispersion compensator can be obtained by letting other components have a dispersion compensating function.

1.6. Others

For a modulated optical signal generator of the present invention, parts that are used for an optical device other than those described above may be used as appropriate.

2. FSK Modulated Signal Generator

For an FSK modulated signal generator, ones described in U.S. Pat. Nos. 5,883,922, 5,852,636, 5,706,310, 5,539,770, 5,450,032, and Japanese Patent Application Laid-Open Publication No. 11-17746 can be mentioned. The FSK modulated signal generator of the present invention may adopt the arrangement described in these documents as appropriate.

Figure 3:
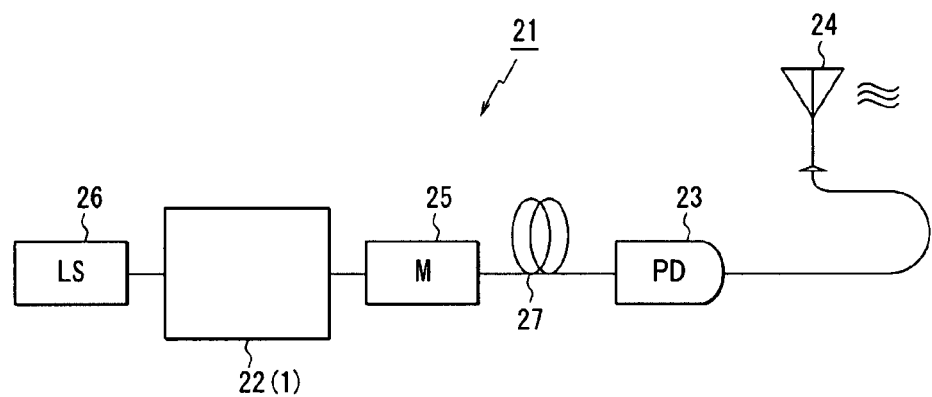
FIG. 3 is a schematic diagram showing a basic arrangement of an FSK modulated signal generator of the present invention.

FIG. 3 is a schematic diagram showing a basic arrangement of the FSK modulated signal generator of the present invention. As shown in FIG. 3, the FSK modulated signal generator of this embodiment is provided with a modulated optical signal generator (22), a photodetector (23), and an antenna (24), and controls a frequency of a light signal outputted from the multiply optical modulator by controlling a modulating frequency of the modulated optical signal generator, thereby controlling the frequency of the radio signal emitted from the antenna (24) and performing a frequency shift keying. It is to be noted that in FIG. 3, M(25) represents a modulator such as an optical intensifier, an LS(26) represents a light source, and 27 represents an SMF (single mode fiber).

2.1 Modulated Optical Signal Generator

For a modulated optical signal generator, the one described above can be used.

2.2 Photodetector

A photodetector is a means for detecting an output light of the modulated optical signal generator to be converted into an electric signal. For a photodetector, a publicly known one can be adopted. For a photodetector, devices including a photodiode, for example, may be adopted. As a photodetector, one that detects an optical signal to be converted into an electric signal can be mentioned. With the photodetector, intensity, frequency, and the like of an optical signal can be detected. As the photodetector, one described in [Hiroo Yonezu, "optical communication device engineering"—photoemitter/photoreceptor device—, Kougakutosho Ltd. 6-th edition, 2000] may be appropriately adopted.

2.3 Antenna

An antenna is a means for emitting the electric signal converted by the photodetector as a radio signal. For an antenna, a publicly known antenna can be used.

3. Effect

Figure 4:
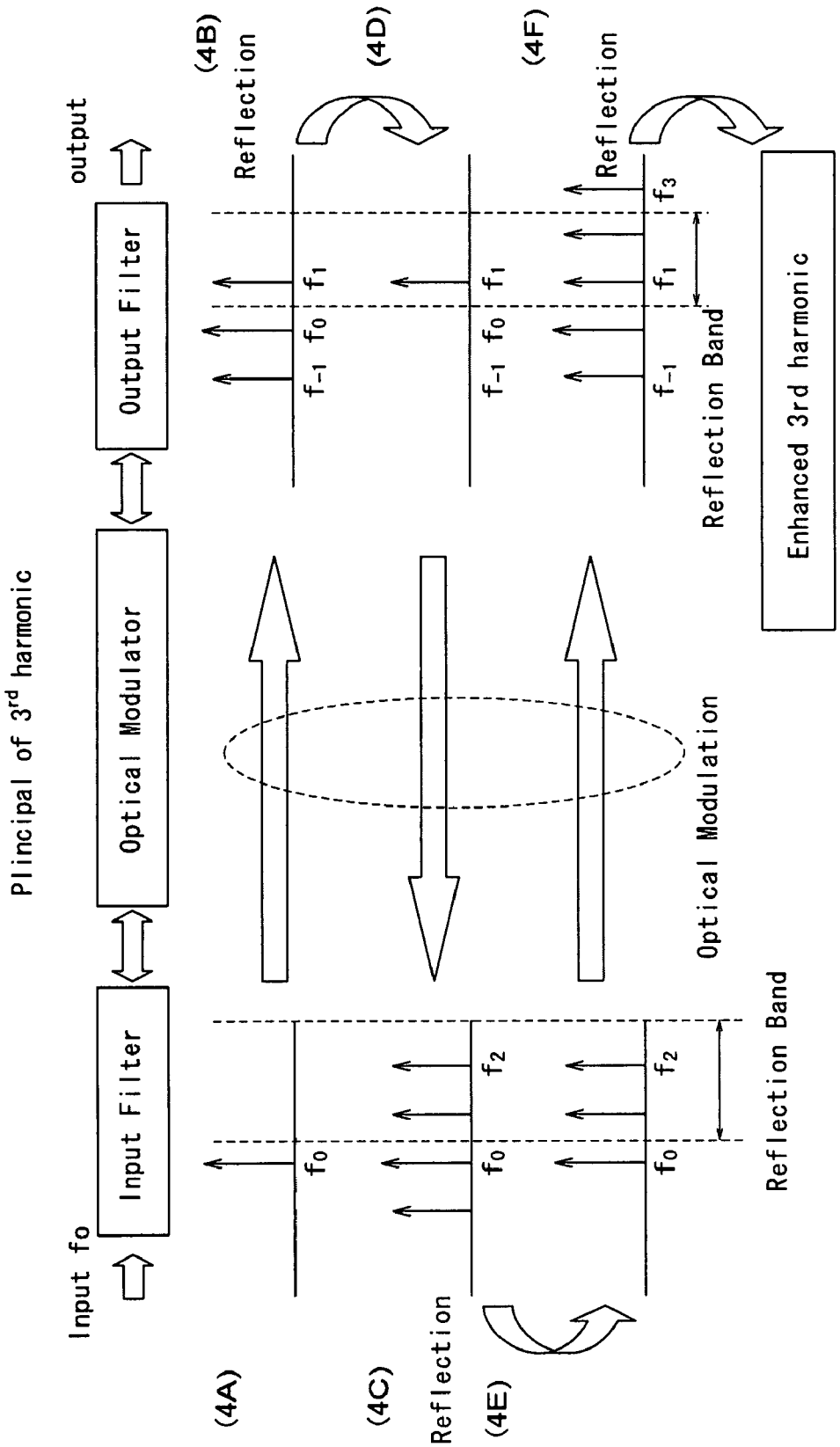
FIG. 4 is a schematic diagram showing transition states of a signal within a modulated optical signal generator of the present invention.
Figure 8:
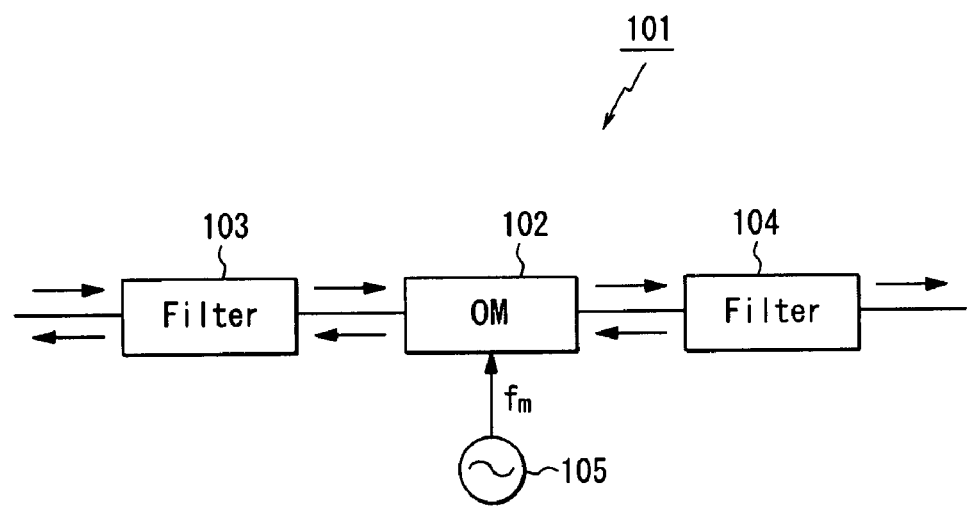
FIG. 8 is a block diagram (FIG. 1 of Japanese Patent No. 3404528) showing a basic principle of a conventional optical frequency converter by a multiplying modulation.
Figure 9A:
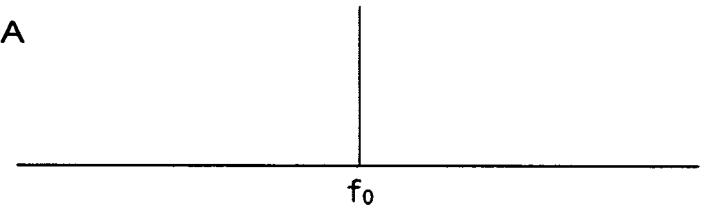
FIGS. 9(A)-9(G) are schematic diagrams showing a light in each of processes.
Figure 9B:
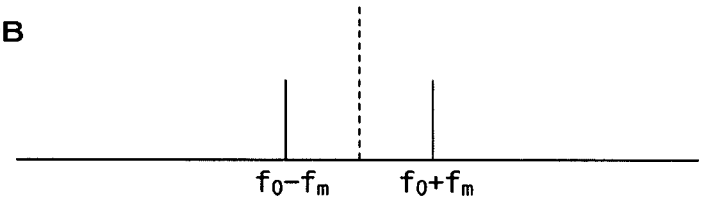
Figure 9C:
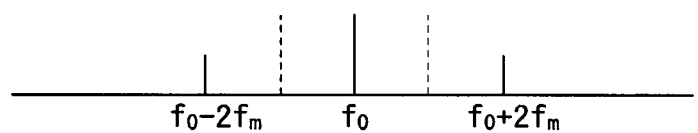
Figure 9D:
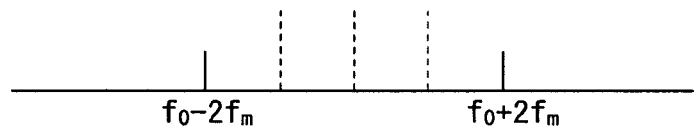
Figure 9E:
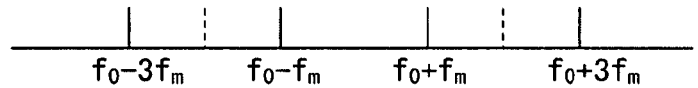
Figure 9F:
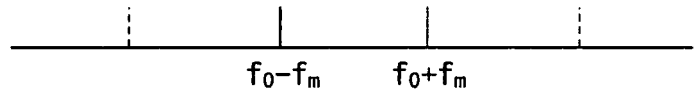
Figure 9G:
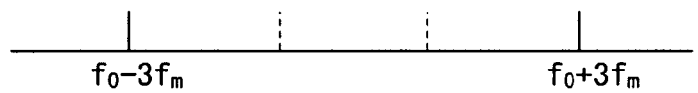

FIG. 4 is a schematic diagram showing an example of a signal transition state within a modulated optical signal generator of the present invention. As shown in FIG. 4(A), an input light is a light having a single frequency $f_0$ [Hz]. The light of the frequency $f_0$ inputted through the first optical filter (3) is modulated by the optical modulator (2) to generate sideband waves ($f_{-1}$: $f_0-f_m$, and $f_1$: $f_0+f_m$) as shown in FIG. 4B. The primary sideband wave ($f_1$: $f_0+f_m$) shown in FIG. 4(D) is reflected by the second optical filter (4) and pass though the optical modulator (2) again. Upon passing through the optical modulator (2), this light is modulated and combined with the carrier wave and the primary sideband wave, thereby assuming lights ($f_{-1}$, $f_0$, $f_1$, and $f_2$: $f_0+3f_m$) having spectrum shown in FIG. 4(C). Among these lights, $f_0$, $f_1$, and $f_2$ shown in FIG. 4(E) are reflected by the first optical filter (3). The lights reflected by the first optical filter (3) pass through the optical modulator (2) again. Then, these lights are modulated by the optical modulator (2), thereby assuming lights having spectrums shown in FIG. 4(F). Among these lights, the light having the third-order sideband wave ($f_0+3f_m$) passes through the second optical filter (4). Thus, the light of the third-order upper sideband wave is outputted as the output light from the modulated optical signal generator.

It is to be noted that by changing the frequency fm of the modulating signal outputted from the RF signal source (5), the frequency of the output light outputted from the modulated optical signal generator can be changed. Also, when the modulating signal applied to the optical modulator (2) is changed, the light of the third-order lower sideband wave ($f_0-3f_m$) is generated from the modulated optical signal generator. By changing this modulating signal at a high speed, the frequency of the output light outputted from the modulated optical signal generator can be changed at a high speed. It is to be noted that while an example of a modulated optical signal generator using the light of the third-order sideband wave region is described in this operation example, the frequency of the output light can also be changed by changing a transmitting region of the second optical filter (4).

It is to be noted that the operation of the modulated signal generator is as described above to have a high order sideband waves generated by the modulated optical signal generator, which is converted into a radio signal by the photodetector and the antenna and emitted.

EXAMPLE 1

FIG. 5 is a diagram showing an arrangement of a modulated signal generator for exemplifying the present invention. FIG. 5(A) is a schematic diagram of the apparatus. FIG. 5(B) is a diagram showing an arrangement of actual two T-FBG's (corresponding to optical filters), and a PM. The T-FBG's in FIG. 5(A) represent fiber gratings that can perform modulation, the PM represents a phase modulator for which a traveling-wave-type is used. The RF signal is inputted to both ports of an RF signal input port and an RF signal output port. In FIG. 5(A), an LS (26) represents a light source. A light (whose wavelength is 1550 nm and whose frequency is supposed to be $f_0$ in this embodiment) is passed through an isolator which is not shown. An isolator manufactured by Newport Corporation is used for the isolator. This light is reflected between the T-FBG's, and passed though the FSK modulator a plurality of times. For the T-FBG's whose full width at half maximum is 47 GHz, those manufactured by 3M Company are used. Also, an optical delay in the two T-FBG's is 454.5 ps. For the optical modulator, one manufactured by Sumitomo-Osaka Cement Co., Ltd. is used. The modulating signal ($f_m$) of 4.4 GHz with an output of 21.4 dBm is applied. The bandwidth at this time has been approximately 20 MHz-100 MHz. FIG. 6 is a spectrum of the output light from the modulated signal generator. In FIG. 6, compared to the carrier wave such as the twelfth harmonic wave, a plurality of lights having shifted the modulating signal by a fixed number of times, and the outputs are suppressed since the lights of the reflecting region of the FBG's are reflected by the FBG's. Also, while stable outputs could be obtained by shifting the frequency of the modulating signal, the frequencies rendering effective modulation have been 2.2 GHz, 4.4 GHz, and 6.6 GHz. It is to be noted that in this embodiment, even if an optical modulator such as an intensity modulator is substituted for the phase modulator, the upper sideband waves and the lower sideband waves can be similarly obtained.

FIG. 7 is a measurement result showing a state of the output radio signal. FIG. 7(A) is a spectrum diagram showing the output spectrum. FIG. 7(B) is a graph showing a temporal change of the output radio signal. From FIG. 7(A), it is seen that a millimeter wave signal (radio signal) of a high signal purity can be obtained by the modulated signal generator of this embodiment. Also, from FIG. 7(B), it is seen that a fixed output can be maintained as the output of the millimeter wave signal.

INDUSTRIAL APPLICABILITY

A modulated optical signal generator of the present invention can be utilized in the field of the optical information and telecommunications. An FSK modulated signal generator can be utilized as a millimeter wave source in the fields of the radio information and telecommunications.

The invention claimed is:

1. An optical frequency shift keying modulator utilizing a reciprocating modulation, comprising:
an optical modulator (2) modulating a light outputted by controlling a frequency of a modulating signal to generate a signal having side band frequencies of and $f_0-n_1f_m$ and $f_0+n_2f_m$ wherein $f_0$ is frequency of input light, $n_1$ and $n_2$ are modulation order, and $f_m$ is frequency of modulation signal;

a first optical filter (3) transmitting a light of a predetermined frequency domain among a light inputted to the optical modulator (2) and a light outputted from the optical modulator (2) while reflecting a light of other frequencies;

a second optical filter (4) transmitting a light of a predetermined frequency domain among a light inputted to the optical modulator (2) and a light outputted from the optical modulator (2) while reflecting a light of other frequencies; and an RF signal source (5) generating the modulating signal inputted to the optical modulator (2);

wherein said optical modulator (2) inputs said side band frequencies $f_0-n_1f_m$ and $f_0+n_2f_m$ to said second optical filter (4), and wherein said side band frequencies $f_0-n_1f_m$ and $f_0+n_2f_m$ are controlled by said optical frequency shift keying modulator by controlling the frequency of the modulating signal, $f_m$, inputted to the optical modulator (2) in such a way that only one of the side band frequencies $f_0-n_1f_m$ and $f_0+n_2f_m$ falls within the predetermined frequency domain in which the second optical filter (4) transmits and said second optical filter of the optical frequency shift keying modulator outputs only one of the side band frequencies, and wherein the RF signal source controls the frequency of the modulating signal to be 1/T multiplied by an even number or an odd number, the T being a time for the light to be transmitted between the two optical filters.

2. The optical frequency shift keying modulator utilizing a reciprocating modulation according to claim 1, wherein the first optical filter (3) comprises a narrowband filter, and the second filter (4) comprises a band limiting filter.

3. The optical frequency shift keying modulator utilizing a reciprocating modulation according to claim 1, including an optical amplifier (6) amplifying intensities of the light inputted to the optical modulator (2) and the light outputted from the optical modulator (2).

4. The optical frequency shift keying modulator as set forth in claim 1, wherein the RF signal source controls the frequency of the modulating signal to be 1/T multiplied by an even number when in-phase modulation is applied to light that travels in forward direction and in backward direction.

5. The optical frequency shift keying modulator as set forth in claim 1, wherein the RF signal source controls the frequency of the modulating signal to be 1/T multiplied by an odd number when reverse-phase modulation is applied to light that travels in forward direction and in backward direction.

6. An FSK modulated signal generator performing a frequency shift keying comprising:

said optical frequency shift keying modulator utilizing a reciprocating modulation according to any one of claims 1-3 or 4-5;

a photodetector (23) detecting an output light of the modulated optical signal generator to be converted into an electric signal; and an antenna (24) emitting the electric signal converted by the photodetector as a radio signal;

wherein a frequency of an optical signal outputted from the multiplying optical modulator is controlled by controlling a modulating frequency of the modulated optical signal generator, whereby a frequency of the radio signal emitted from the antenna is controlled and the frequency shift keying is performed.

* * * * *